(12) United States Patent
Derluyn et al.

(10) Patent No.: US 8,399,911 B2
(45) Date of Patent: Mar. 19, 2013

(54) ENHANCEMENT MODE FIELD EFFECT DEVICE AND THE METHOD OF PRODUCTION THEREOF

(75) Inventors: Joff Derluyn, Brussels (BE); Steven Boeykens, Sint-Amands (BE); Marianne Germain, Liege (BE); Gustaaf Borghs, Kessel-Lo (BE)

(73) Assignee: IMEC, Leuven (BE)

( * ) Notice: Subject to any disclaimer, the term of this patent is extended or adjusted under 35 U.S.C. 154(b) by 1 day.

(21) Appl. No.: 11/759,091

(22) Filed: Jun. 6, 2007

(65) Prior Publication Data

US 2008/0006845 A1    Jan. 10, 2008

Related U.S. Application Data

(60) Provisional application No. 60/811,661, filed on Jun. 7, 2006.

(30) Foreign Application Priority Data

Jul. 28, 2006   (EP) ..................................... 06118063

(51) Int. Cl.
  *H01L 29/66*  (2006.01)
(52) U.S. Cl. ................. 257/192; 257/194; 257/E31.067
(58) Field of Classification Search .................. 257/192, 257/194, E31.067
  See application file for complete search history.

(56) References Cited

U.S. PATENT DOCUMENTS 6,140,169 A    10/2000  Kawai et al.
7,382,001 B2 *  6/2008  Beach ........................... 257/194
2005/0023555 A1  2/2005  Yoshida et al.
2006/0006414 A1 *  1/2006  Germain et al. ............... 257/192
2006/0226442 A1 *  10/2006  Zhang et al. .................. 257/192
2007/0164322 A1 *  7/2007  Smith et al. ................... 257/256

FOREIGN PATENT DOCUMENTS

| EP | 0 064 370 A2 | 11/1982 |
| EP | 1 612 866 A2 | 1/2006 |
| JP | 57 176773 A | 10/1982 |
| JP | 57 180186 A | 11/1982 |
| JP | 57 193069 A | 11/1982 |
| JP | 61 144881 A | 7/1986 |

(Continued)

OTHER PUBLICATIONS

Saito W., et al., "Recessed-gate structure approach toward normally off high-Voltage AlGaN/GaN HEMT for power electronics applications", IEEE Transactions on Electron Devices, Feb. 2006, pp. 356-362, vol. 53, No. 2, USA, XP002409435.

(Continued)

*Primary Examiner* — Jerome Jackson, Jr.
*Assistant Examiner* — Dale E Page
(74) *Attorney, Agent, or Firm* — Knobbe Martens Olson & Bear LLP (57) ABSTRACT

A method is disclosed for producing Group III-N field-effect devices, such as HEMT, MOSHFET, MISHFET or MESFET devices, comprising two active layers, e.g. a GaN/AlGaN layer. The method produces an enhancement mode device of this type, i.e. a normally-off device, by providing a passivation layer on the AlGaN layer, etching a hole in the passivation layer and not in the layers underlying the passivation layer, and depositing the gate contact in the hole, while the source and drain are deposited directly on the passivation layer. The characteristics of the active layers and/or of the gate are chosen such that no two-dimensional electron gas layer is present underneath the gate, when a zero voltage is applied to the gate. A device with this behavior is also disclosed.

19 Claims, 3 Drawing Sheets

FOREIGN PATENT DOCUMENTS

JP          2003115487        *   4/2003
JP          2005 183733 A         7/2005

OTHER PUBLICATIONS

X. Hu, G. Simin, J. Yang, M.A. Khan, R. Gaska, M.S. Shur, "Enhancement mode AlGaN/GaN HFET with selectively grown pn junction gate", Elec. Lett. vol. 36, No. 8, pp. 753-754, 2000.

Y. Cai, Y. Zhou, K.J. Chen, K.M. Lau, "High-performance enhancement-mode AlGaN/GaN HEMTs using fluoride-based plasma treatment", IEEE Elec. Dev. Lett. vol. 26, No. 7, pp. 435-437, 2005.

V. Kumar, A. Kuliev, T. Tanaka, Y. Otoki, I. Adesida, "High transconductance enhancement-mode AlGaN/GaN HEMTs on SiC substrate", Elec. Lett. vol. 39, No. 24, pp. 1758-1759, 2003.

W.B. Lanford, T. Tanaka, Y. Otoki, I. Adesida, "Recessed gate enhancement mode GaN HEMT with high threshold voltage", Elec. Lett. vol. 41, No. 7, pp. 449-450, 2005.

J. Kuzmik, 'Power Electronics no InAnN/(In)GaN prospect for a record performance', IEEE Electron Device letters, vol. 22, N° 11, Nov. 2001.

European Search Report for EP 06118063.4 dated Dec. 13, 2006.
European Search Report for EP 07109112.8 dated Aug. 14, 2007.

\* cited by examiner

ENHANCEMENT MODE FIELD EFFECT DEVICE AND THE METHOD OF PRODUCTION THEREOF

CROSS REFERENCE TO RELATED APPLICATIONS

This application claims priority under 35 U.S.C. §119(e) to U.S. provisional patent application 60/811,661 filed on Jun. 7, 2006, which application is hereby incorporated by reference in its entirety.

BACKGROUND OF THE INVENTION

1. Field of the Invention

The present invention is related to group III-nitride field effect devices (e.g. comprising a GaN/AlGaN layer) and methods to produce an enhancement mode device of this type, i.e. a normally-off device, in which no current can flow between source and drain contact unless a positive voltage is applied to the gate.

2. Description of the Related Technology

Field effect devices of the type described above, e.g. High Electron Mobility Transistors (HEMT) comprise a two-dimensional electron gas (2 DEG) between two active layers, e.g. between an GaN layer and a AlGaN layer deposited on a Si substrate. This 2DEG layer is a consequence of piezoelectric polarization leading to charge separation within the materials. In known devices of this type, the 2DEG is present at zero gate bias due to the characteristics of the materials. GaN field effect transistor devices (FET) with contacts formed on top of the AlGaN layer are normally-on devices. The formation of contacts on the AlGaN does not change the charge polarization in the heterostructure so that if there was a 2DEG present before processing, it will remain there after formation of contacts on top of the AlGaN. A certain negative voltage, called threshold voltage, on the gate is needed to deplete the 2DEG through capacitive coupling. By applying a negative voltage to the gate, the electron channel can be pinched off. This negative voltage is typically below a negative threshold voltage (Vth), typically between −4 and −8 V. These transistors work in depletion-mode (D-mode): the channel has to be depleted to switch off the transistor.

In EP-A-1612866, a passivation layer is proposed on top of the device to solve several problems. It is intended to protect the surface of the GaN from contamination by air exposure. Furthermore, the passivation is able to stabilize the surface states of the AlGaN surface. This reduces the DC-to-RF dispersion and consequently increases the switching frequency. The passivation layer also improves the reproducibility of the device because it limits modifications of the top surface charge that influence the charge density in the 2DEG. One of the main characteristics for power switching devices in the linear operating regime is the on-state resistance. This is determined essentially by the value of the contact resistance of the Ohmic source and drain contacts, as well as by the sheet resistance of the 2DEG channel. To minimize losses, this on-state resistance should be minimal. The passivation layer mentioned in EP-A-1612866 allows for a better Ohmic contact formation. Also, a higher current density is achieved because the passivation layer on top of the AlGaN-layer has characteristics that increase the two-dimensional electron gas by introducing a higher strain in the heterostructure when compared to the device without this passivation layer.

For certain applications, such as power switching or integrated logic, a negative-polarity gate voltage supply is unwanted: the gate control of power devices in e.g. power supplies should be made similar to that used for Si devices. Field-Effect Transistors (FET) with a threshold voltage Vth=0V are normally-off devices. At zero gate voltage, no channel is present to conduct current. These transistors work in enhancement-mode (E-mode). E-mode transistors are attractive for normally-off power switches, for digital electronics applications, and for high efficiency RF applications.

To make a normally-off device, i.e. a device where no current can flow between source and drain contact when the gate is floating or grounded, one can interrupt the channel selectively under that gate contact while at the same time preserving as high as possible 2DEG density in the other regions. A positive threshold voltage will then induce 2DEG under the gate contact, allowing current to flow between source and drain. Several methods have been reported to achieve such an enhancement mode transistor:

- selectively regrown p-n junction for the gate (X. Hu, G. Simin, J. Yang, M. A. Khan, R. Gaska, M. S. Shur, "Enhancement mode AlGaN/GaN HFET with selectively grown pn junction gate", Elec. Lett. Vol. 36, No. 8, pp. 753-754, 2000),
- CF4 plasma treatment of the AlxGa1−xN (Y. Cai, Y. Zhou, K. J. Chen, K. M. Lau, "High-performance enhancement-mode AlGaN/GaN HEMTs using fluoride-based plasma treatment", IEEE Elec. Dev. Lett. Vol. 26, No. 7, pp. 435-437, 2005)
- gate recess techniques with or without post-etch RTA treatment (V. Kumar, A. Kuliev, T. Tanaka, Y. Otoki, I. Adesida, "High transconductance enhancement-mode AlGaN/GaN HEMTs on SiC substrate", Elec. Lett. Vol. 39, No. 24, pp. 1758-1759, 2003 and W. B. Lanford, T. Tanaka, Y. Otoki, I. Adesida, "Recessed gate enhancement mode GaN HEMT with high threshold voltage", Elec. Lett. Vol. 41, No. 7, pp. 449-450, 2005)

In the last case, part of the AlGaN layer is selectively removed under the gate contact. As a result the remaining AlGaN is not thick enough and is not sufficiently strained relative to the GaN to create a 2DEG in between the two materials. However, a recessed gate is not a straightforward implementation. Since wet etching cannot be applied on AlxGa1−xN (no chemical etchant is known to have a significant etch rate on AlxGa1−xN), one needs to resort to dry etching techniques to remove the AlGaN (and III-nitrides in general). Plasma-assisted dry etching can be done. Dry etching of group-III nitrides is however not selective of one material composition to another. The etch rate for the typically used $Cl_2$-based plasma is difficult to control and reproduce. The minimum etch rate obtained at the moment is around 100 nm/min, being still too high to reproducibly etch the $Al_xGa_{1-x}N$ top layer from the 22 nm thickness to exactly 5 nm. Moreover, dry etching of group-III nitrides is known to cause an increase in the density of surface states which in their turn cause dispersion effects. Dry etching introduces a lot of defect states, resulting in a Schottky gate with high leakage current. A possible solution is an RTA anneal after the etch step. This, however, introduces yet another extra processing step, with a critical gate alignment step.

SUMMARY OF CERTAIN INVENTIVE ASPECTS

One inventive aspect is a method to produce group III-Nitride enhancement mode field-effect devices, like high electron mobility transistor (HEMT), metal insulator semiconductor heterostructure field effect transistor (MISHFET) or metal oxide semiconductor heterostructure field effect transistor (MOSHFET) or metal semiconductor field effect transistor (MESFET) devices. Certain of the inventive aspects overcome the etching problem encountered in other enhancement mode transistors. The controllability of the fabrication process is much improved. A low on-state resistance of the device is achieved, i.e. a high channel current density, in combination with low Ohmic contact resistances. Also the creation of surface states is minimized and the passivation of surface states is preserved.

In another aspect, a semiconductor device is disclosed. The device comprises a first active layer on a substrate, and a second active layer on the first active layer, the second active layer having a higher band-gap than the first active layer. The device further comprises a passivation layer on the second active layer. The device further comprises a source contact and a drain contact directly on the passivation layer. The device further comprises at least one hole in the passivation layer, the at least one hole being located between the source and drain contact and not protruding into the layers underlying the passivation layer. The device further comprises a gate contact in the hole, wherein a two-dimensional electron gas layer is present between the active layers, outside of the location of the gate contact, and wherein no substantial two-dimensional electron gas layer is present between the active layers, directly underneath the gate contact, when the gate and source contact are at the same voltage.

In another aspect, a method of fabricating a semiconductor device is disclosed. The method comprises depositing a first active layer on a substrate. The method further comprises depositing a second active layer on the first active layer, the second active layer having a higher band-gap than the first active layer. The method further comprises depositing a passivation layer on the second active layer. The method further comprises depositing a source electrode and a drain electrode in direct electrical contact with the passivation layer. The method further comprises etching at least one hole in the passivation layer, the at least one hole being located between the source and drain electrode and not protruding into the layers underlying the passivation layer. The method further comprises depositing a gate contact in the hole.

In another aspect, a method of using a semiconductor device such as one described above is disclosed. The method comprises applying a voltage between the source and drain contacts, such that the drain contact has a higher potential than the source contact. The method further comprises applying a positive voltage above a threshold voltage on the gate contact relative to the source contact such that the a two-dimensional electron gas layer is created between the first active layer and the second active underneath the gate contact, thereby forming a current between source and drain contacts.

DETAILED DESCRIPTION OF CERTAIN EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

In the context of the present invention and except if specified otherwise, the term 'on' when referring to the relative position of two layers, can mean 'directly or immediately on' (i.e. without intermediate layer) or can also mean 'above, with one or more intermediary layers'.

Certain embodiments aim to provide an enhancement mode (i.e. normally-off) field effect transistor device that overcomes the etching problem encountered in other enhancement mode transistors.

Figure 1:
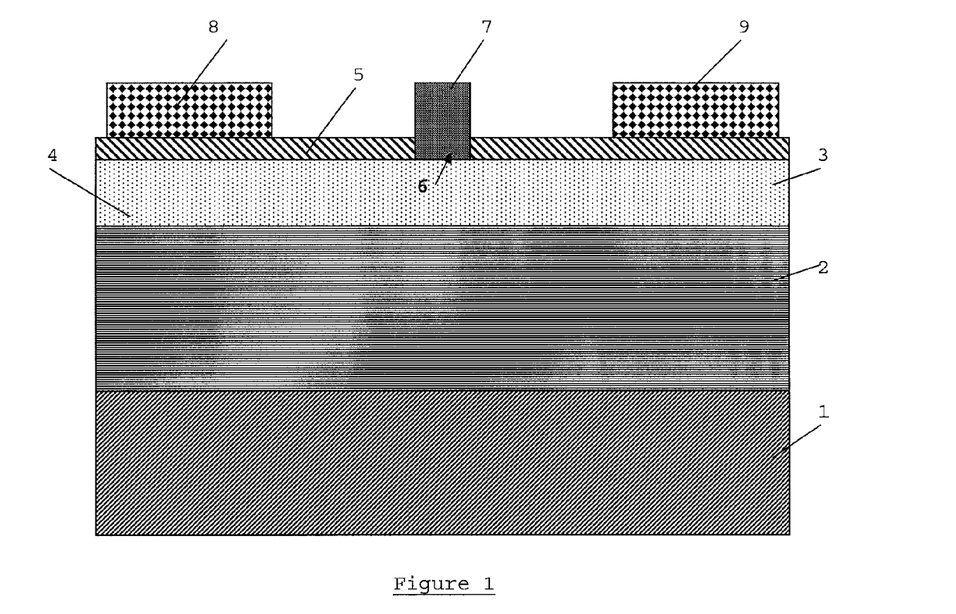
FIG. 1 represents a High electron mobility transistor (HEMT) according to one embodiment.

According to the method of one embodiment and with reference to FIG. 1, a substrate (1), e.g. a sapphire substrate, is placed in a reaction chamber (not shown). A first active layer (2), e.g. a GaN layer, is deposited on the substrate, and a second active layer (3), e.g. an AlGaN layer, is deposited on the first active layer. In general, the second active layer (3) has a higher band-gap when compared to the first active layer. Alternative materials for the substrate and first and second active layers are given further in this description, as well as possible techniques for depositing the layers.

Depending on the thickness, the composition and the loading effects on the surface of the second active layer (3), a two-dimensional electron gas (2 DEG) may appear at the interface (4) between the two active layers. According to a first embodiment, the thickness, the composition and the loading effects on the surface of the second active layer (3) are chosen such that substantially no 2DEG is created at the interface between the two active layers. One way of obtaining this result is e.g. to choose the second active layer to be thinner than a predefined minimum thickness. The result is that the 2DEG at the interface between the two active layers is absent. The physical conditions to induce a highly conductive 2DEG between the first and the second active layer are not met without further process steps or extra layers.

The conduction of current in HEMT devices is realized by the presence of a 2DEG layer, typically located at or near the interface of two active layers. The active layers in HEMT devices are the layers that contribute to the formation of the 2DEG layer. In fact the 2 DEG-layer is created by the combination of an active layer with a low bandgap and an active layer with a high bandgap. Charges are created in the high bandgap material and can be created in different ways: for example the high bandgap layer can be spontaneously or piezo-electrically polarized thereby creating fixed charges of opposite polarity at both interfaces, or the whole layer or part of the layer can be highly doped thereby creating free electrons. The fixed charges in a polarized high bandgap material attract free charges to the other side of the interface to create the 2DEG layer whereas the free charges created in the highly doped high bandgap material diffuse into the 2DEG layer. This 2DEG is typically located in the low bandgap material near the interface of the active layers. Thus the active layers are intrinsic to the transistor effect.

A passivation layer protects the transistor from external modifications, such that the transistor characteristics are as less as possible affected by extrinsic parameters, such as modifications of electrical charges on the surface. A passivation layer fixes or freezes the existing state of the surface of underlying (active) layers. Consequently this surface of the underlying (active) layers is no longer sensitive to changes in the environment and the effect of the state of the surface of the underlying (active) layers on the properties of the underlying layer is no longer sensitive to changes in the environment.

After the deposition of the active layers (as defined above), a passivation layer (5), equally as defined above, is then deposited on the second active layer (3). The deposition parameters and the composition of the passivation layer are chosen such that a two-dimensional electron gas is created between the first and the second active layer after the deposition of the passivation layer. A possible way to obtain this effect is an in-situ deposition of the passivation layer immediately after the deposition of the second active layer. With 'in situ' is meant that the passivation layer is applied before cooling down the device, for example by depositing the passivation layer in the same reaction chamber as the deposition of the first and second active layer. That way the strain-induced modifications during cooling down are reduced. Consequently, a higher strain is introduced in the heterostructure without damaging the mechanical properties of the second active layer. Consequently 2 DEG is created in between the first and second active layer. This procedure is described in document EP-A-1612866, which is incorporated herein by reference.

The 2DEG is then interrupted by etching holes (6) in the passivation layer. As shown in the appended drawings, the holes are etched in the passivation layer, and essentially not protruding into the layers underlying the passivation layer. In other words, the holes are stopping in the passivation layer or on the second active layer. The depth of the holes is smaller than or equal to the local thickness—measured at the location of the hole—of the passivation layer. This is preferably done by using a selective etching process, as explained further in the present description. Possibly a thin passivation layer may still be present at the bottom of the holes. At the locations where the passivation layer is etched, the strain in the second active layer is relieved and consequently, the 2DEG layer is removed at the locations where the holes are etched. This allows removing the 2DEG layer under the holes in the passivation layer while at the same time preserving as high as possible 2DEG density in the other regions. Still according to the first embodiment, a gate (7) is deposited in the holes in the passivation layer and possibly partially on top of the passivation layer, a source (8) and a drain (9) electrode are deposited in electrical contact with the passivation layer (5). The production of the gate does not influence the 2DEG layer: underneath the gate, no 2DEG layer is present. Because of the absence of a 2DEG layer underneath the gate (7), no current will flow between source and drain contact when the gate is floating or grounded. A positive voltage above a threshold voltage will induce 2DEG under the gate contact, allowing current to flow between source and drain. In this way, an enhancement mode (normally off) transistor is created. In the first embodiment, it is preferred to remove the complete thickness of the passivation layer to form the holes (6). However, it is also possible to remove only a part of the thickness of the passivation layer, in other words to remove a sufficient volume of the passivation layer to result in the absence of a 2DEG layer underneath the holes (6).

According to a second embodiment, after the deposition of the second active layer, a 2DEG, preferably a low density 2DEG is nevertheless present between the first and second active layer. This may be the case e.g. when the second active layer is slightly thicker than the pre-defined minimum thickness. In the same way as in embodiment 1, a passivation layer is deposited in-situ on the second active layer, thereby enhancing the 2DEG in between first and second active layer.

According to the second embodiment, hole(s) (6) are also etched in the passivation layer, but due to the characteristics of the first and second active layers, a 2DEG is still present at the location of these holes. Still according to this second embodiment, a gate is deposited in the holes, and source and drain contacts are produced on the passivation layer. According to one aspect of the second embodiment however, the work function of the gate is chosen such that the 2DEG underneath the gate is eliminated (this effect is e.g. described in 'Power Electronics no InAnN/(In)GaN prospect for a record performance', J. Kuzmik, IEEE Electron Device letters, vol. 22, No. 11, November 2001, which is incorporated herein by reference). According to another aspect of the second embodiment, this elimination is obtained by creating suitable surface states through a plasma treatment (this effect is e.g. described by Y. Cai in 'High-performance enhancement-mode AlGaN/GaN HEMTs using fluoride-based plasma treatment', IEEE Electron Device Letters, Vol. 26, No. 7, July 2005, which is incorporated herein by reference). In the latter case, the whole thickness of the passivation layer is to be removed in the holes (6). Therefore also according to the second embodiment, an enhancement mode device is obtained.

According to both embodiments, because the passivation is still present underneath the source and drain, a 2 DEG will be present underneath source and drain and the channel between source and drain is completed when a positive voltage is applied to the gate. The passivation layer underneath the source and the drain allows reducing the Ohmic contact for source and drain.

More details on possible materials, process parameters, deposition methods, extra layers, etc. are given below.

The substrate (1) may consist of any material that can be used as a substrate for III-V processing, such as silicon, sapphire ($Al_2O_3$), SiC, GaN, AlN, GaAs or diamond. Also substrates comprising one or more of these materials can be used, such as silicon on insulator or GaN on diamond. Consequently a first (2) and second (3) active layer need to be deposited on top of the substrate (1). To facilitate the growth and to increase the quality of these active layers, extra layers can be included.

A nucleation layer (not shown) can be grown on the substrate (1). This nucleation layer acts as a transition layer between substrate and active layers. It permits the start of epitaxial growth on substrates that are chemically and structurally (very) different from the epitaxial layers by first creating isolated islands of deposited layers which later coalesce in a single layer. Typically the nucleation layer comprises or consists of GaN, AlGaN or AlN and has a thickness approximately between 1 nm and 100 nm.

A buffer layer (not shown) can be produced on the nucleation layer. As the nucleation layer may be defective, an intermediate buffer layer may be needed to decrease the defect density in the active layers. This buffer layer can comprise one or more layers such as a layer comprising or consisting of GaN, AlGaN or AlN. The thickness of these layers varies approximately between 20 nm and 500 nm and allows bending of propagating threading dislocations away from the vertical growth directions. The properties of the nucleation and buffer layer directly influence the properties of the active layers, e.g. in terms of dislocation density and material resistivity.

The first and/or second active layers (2,3) can be, e.g., group III nitride semiconductor material. They are preferably but not exclusively, monocrystalline layers. The first active layer can comprise or consist of GaN, AlGaN, InGaN, InAlGaN, BN or combinations thereof. The second active layer can comprise or consist of AlGaN, AlInN, and InAlGaN. When the active layers comprise several of the elements listed above, they are built from several layers of the respective elements, deposited one on top of the other. The bandgap of the second active layer needs to be higher than the bandgap of the first active layer. Often the first active layer is a GaN layer and the second active layer is an AlGaN layer. In between the first and second active layer, a spacer can be deposited. Such spacer layer repulses the electron wave function out of the AlGaN into the GaN away from the interface between the two layers. In this way, the electron wave function overlaps less with possible interface roughness or electrical roughness caused by compositional non-uniformity. Hence scattering is reduced which in turn increases the electron mobility. In the best case the spacer has a high bandgap and is very thin, for example around 1 nm or even less. The spacer can be AlN.

Also a third active layer (not shown) may be produced under the first active layer, i.e. applied on the substrate or on the nucleation layer or on the buffer layer, prior to the production of the first active layer. The third active layer can have a higher bandgap than the first active layer. This third active layer can comprise, e.g., a group III nitride material. The third active layer can comprise or consist of AlGaN, AlN, InAlGaN or InAlN. The thickness can be approximately between 50 nm and 2 μm thick. Its higher bandgap prevents electrons from entering this layer during pinch-off so that they cannot be caught in traps which would lead to dispersion effects.

Before deposition of the passivation layer, the second active layer can be provided with a doping element. For example, an AlGaN layer can be doped with Si, in the order of about $10^{17}$ to $10^{19}$ Si-atoms/cm$^3$. This doping can be applied in order to improve the ohmic contacts.

The passivation layer (4) preferably comprises an electron donating element and nitrogen for passivating the surface states. The passivation layer can comprise or consist of SiN, BN, Si, CN or GeN. The thickness can be chosen between about 1 nm and 5000 nm. In the best case the thickness of the passivation layer is in between about 3 nm and 20 nm. The passivation layer is preferably but not exclusively, an amorphous layer.

For the deposition of the first and second (and third) active layers and of the passivation layer, in particular of a GaN, AlGaN and a SiN layer, Metal Organic Chemical Vapor Deposition growth (MOCVD) can be used. Alternatively, molecular beam epitaxy (MBE) can be used. The creation of a 2 DEG layer is influenced by the thickness, the composition and the loading effects at the surface of the second active material. When a combination of GaN and AlGaN is used, the thickness and Al concentration are determining parameters for the presence or absence of a 2 DEG layer. The thickness of the second active layer can be chosen between about 1 and 10 nm, preferably between 3 and 5 nm, for example in case of AlGaN on GaN.

As mentioned above, the passivation layer (5) should be deposited such that a 2 DEG is created or enhanced between the two active layers. A possible way to obtain this effect is an in-situ deposition of the passivation layer immediately after the deposition of the second active layer. 2 DEG is created or enhanced from the additional strain introduced by the in-situ deposition of the passivation layer. For the deposition of GaN, AlGaN and SiN layer, MOCVD growth can be used, so the passivation layer can be deposited in-situ by MOCVD in an MOCVD reaction chamber. The deposition is done at high temperature (>about 1000C). After deposition, the reaction chamber is cooled down and the device is removed from the reaction chamber. That way it induces additional strain in the AlGaN layer and the strain-induced modifications during cooling down are reduced. This creates or enhances the 2DEG at the interface between the first active layer and the second active layer, for example at the GaN/AlGaN interface. That way it allows obtaining a high 2DEG density for very thin AlGaN layers.

One or more holes (6) are etched in the passivation layer. The controllability of the fabrication process can be improved by etching the passivation layer selectively with respect to the underlying active material. In case a SiN passivation is used on top of AlGaN, removing the passivation selectively to AlGaN can be done by wet etching, e.g. in HF. HF does not etch the AlGaN nor influences the surface states. Besides using boiling KOH, it is nearly impossible to wet etch AlGaN. So any other chemical that etches $Si_3N_4$ (e.g. using HF, buffered HF, HCl) will cause a selectivity of the etching process of at least two orders of magnitude. Removing the passivation selective to AlGaN can also be done using a selective dry etching process, e.g. by SF6/Ar plasma in a RIE/ICP system. The etching rate of SiN can be at least one order of magnitude higher than that of AlGaN.

The gate (7) is deposited in the holes in the passivation layer. A gate contact will be present where the passivation has been removed, i.e. filling the complete width of the hole (6). The gate can eventually be a little wider, so partially located on the passivation layer. This contact is preferably a Schottky contact. Materials that can be used for the gate can be Ni, Pt, Mo, C, Cu, Au and other metals.

When the gate metallization is defined using a lift-off process, the same resist as in the etching step of the passivation can be used, making the process self-aligned. Alternatively, patterning the gate can be done with lithography and dry etching.

Figure 2:
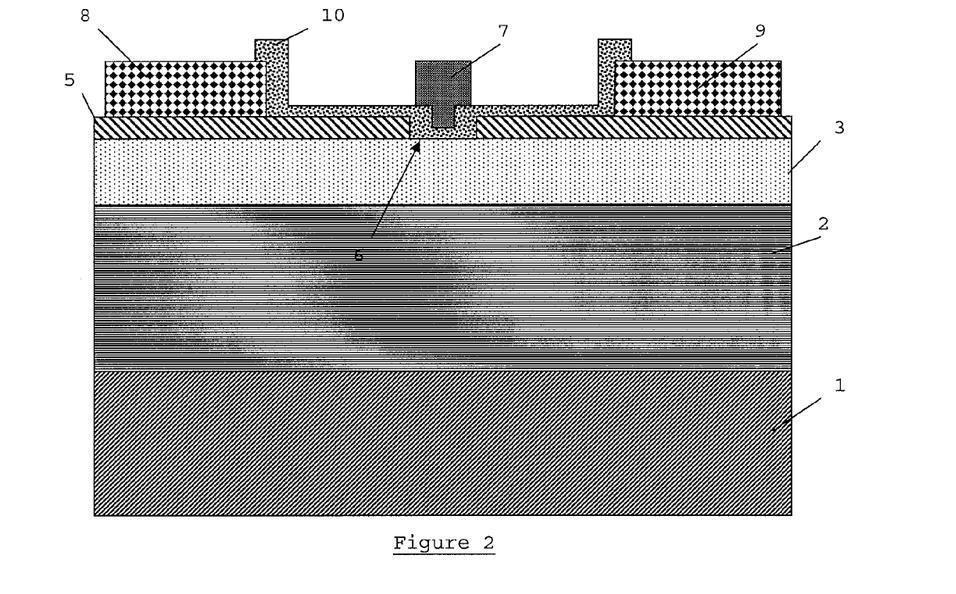
FIG. 2 represents a Metal insulator semiconductor heterostructure field effect transistor (MISHFET) or metal oxide semiconductor heterostructure field effect transistor (MOSHFET) according to one embodiment.

According to both the first and second embodiment, an additional dielectric layer (10) may be deposited on the passivation layer after creation of the holes, and prior to deposition of the gate, so that the dielectric is present between the gate (7) and the second active layer (3) in the finished device. This is illustrated in FIG. 2. The same structures can be found as described in FIG. 1. The dielectric layer may comprise or consist of a high-k dielectric material, such as SiO2, Al2O3, Ta2O5, HfO2, ZrO2, SiN or SiON. It can also comprise or consist of a combination of these materials. Any other dielectric material can be used. The dielectric layer is deposited after etching the holes, but before depositing the gate. The dielectric layer (10) can be located underneath the gate (7) and possibly on the passivation layer (5). As the strain state of this dielectric deposited using different techniques (PECVD, ALD, etc.) is well known, the process parameters can be chosen such that the strain state of the dielectric has a positive influence, limited influence, or no influence on the 2DEG layer. The dielectric layer (10) should not harm the operation of the device. This dielectric layer should not cover the source (8) and drain (9) contacts completely; in the preferred case it is not present on the source and drain contacts. The dielectric layer may be added as a solution to certain drawbacks of the normal Schottky contact by which the gate is formed (e.g. difficult to scale, high leakage current, reaction of metal with semiconductor).

Patterning to define the dielectric layer can be done by a lift-off technique or by completely covering the whole wafer and subsequent metal etching using photo-resist as a mask. Also other methods for patterning known in the art can be used.

The source and drain contacts (8,9) may consist of a metal stack of three groups of metals, of which the first group is in direct contact with the passivation layer and the third group lies on top. The second group is a barrier in between the first and third group. The first group consists typically of Ti/Al or V/Al and forms the direct electric contact to the passivation layer. The third group consists of a metal that can prevent oxidation of the underlying materials (typically Au, WSi2). The second group consists of any material that can prevent mixing of the Au and Al (typically Mo, Ti, Ni, Pt), but can be removed in case the third group does not include Au.

Other processing steps may precede the processing described above, such as etching of mesa, and implantation. Furthermore other processing steps may follow, such as extra passivation on top of the first passivation layer, e.g. SiO2 on top of a SiN layer, airbridges, vias and other processing steps known in the art.

One embodiment is related to a device obtainable by the method described above. Such a device is illustrated in FIGS. 1 and 2. It basically comprises the following parts:

A substrate (1),
A first active layer (2), e.g. a GaN layer,
A second active layer (3), e.g. a AlGaN layer,
A passivation layer (5), e.g. a SiN layer,
A source (8) and drain (9) contact on the passivation layer,
At least one hole (6) in the passivation layer in between the source (8) and drain electrode (9),
A gate electrode (7) in the hole(s),
Possibly a dielectric layer (10) in between the gate electrode and the second active layer, e.g. a SiO2 layer,
A two-dimensional electron gas (2DEG) located between the first and second active layer. The 2 DEG is absent underneath the hole in the passivation layer when the gate is floating or grounded, i.e. when a zero voltage is applied to the gate.

Possible alternative materials in the different layers and components of the device are described above with reference to the method of one embodiment. The device may equally comprise a nucleation layer, a buffer layer and/or a third active layer, produced from materials as described above with reference to the method of one embodiment.

The device can be put in the conductive state as follows. A voltage can be applied between source and drain contacts, such that the drain electrode has a higher potential when compared to the source electrode. A positive voltage (positive relative to the source contact potential) can be applied on the gate electrode above a threshold voltage. That way a 2 DEG can be created underneath the gate contact. Consequently a current between source and drain contacts can be realized. Changing the gate voltage modulates the source drain current which is essential for the transistor operation.

There are several applications for the device according to one embodiment. The transistor can be integrated in a power switching circuit such that the current between source and drain can be controlled by a gate voltage that always remains positive. These circuits can operate at high frequencies and at high temperatures (power densities) and in harsh conditions. It is important for power circuitry that in case of faults, the circuit is automatically brought in a safe state and the devices are not destroyed. This is not the case for normally on HEMT's as when the gate would be accidentally brought to ground potential, the device would continue to conduct current. On top of that, normal operation no longer requires a negative voltage source which simplifies the design.

These transistors can be combined with transistors that do not have a positive threshold voltage to implement a logical circuit. These circuits can operate at high temperatures and in harsh conditions. Logic circuits are the basis for any digital electronic device. If this functionality were to be implemented in GaN, it would allow for electronics that could operate at high operation temperatures (>200 C) and in acid or radiative environments.

EXAMPLE 1

A Thomas Swan close-coupled showerhead reactor was used with starting compounds trimethylgallium (TMGa), trimethylaluminium (TMAl), ammonia (NH3) and silane (SiH4 200 ppm in hydrogen). The silane introduction line is modified in such a way that the amount of silane introduced in the reactor can be regulated from about 5 nmol/min up to about 1 mol/min. As a first step in the growth process, the sapphire substrates are annealed in H2. Then, nitridation of the surface is carried out by introducing NH3 into the reactor. After that, the substrates are cooled down to 525° C. and a thin GaN nucleation layer is grown. Subsequently, the temperature is ramped to 1020° C., and at a pressure of 100 torr GaN is grown to a thickness of 2.6 um. On top of the semi-insulating GaN layer a thin (0.5 nm) AlN spacer layer is grown followed by an AlxGa1−xN layer of thickness 20 to 22 nm. The aluminum content was varied from 30% over 35% to 40%. The thickness of the Al0.3Ga0.7N top layer was varied from 22 nm down to 3 nm. After the growth of the AlGaN layer the reactor was purged for 10 s while maintaining the NH3 flow and the AlGaN growth temperature. Then silane was introduced into the reactor. The SiN is deposited in an MOCVD reactor at elevated temperatures (>1000 C) by flowing SiH4 and NH3 gasses.

A thin $Al_xGa_{1-x}N$ top layer with a low Al concentration results in a decrease of the 2DEG sheet carrier concentration. Lowering the Al content has a negative effect on the polarization induced sheet charge. Moreover, when the thickness of the $Al_xGa_{1-x}N$ barrier is reduced, the 2DEG experiences depletion from the surface states. Both effects result in a transistor with a very high sheet resistance.

Figure 3:
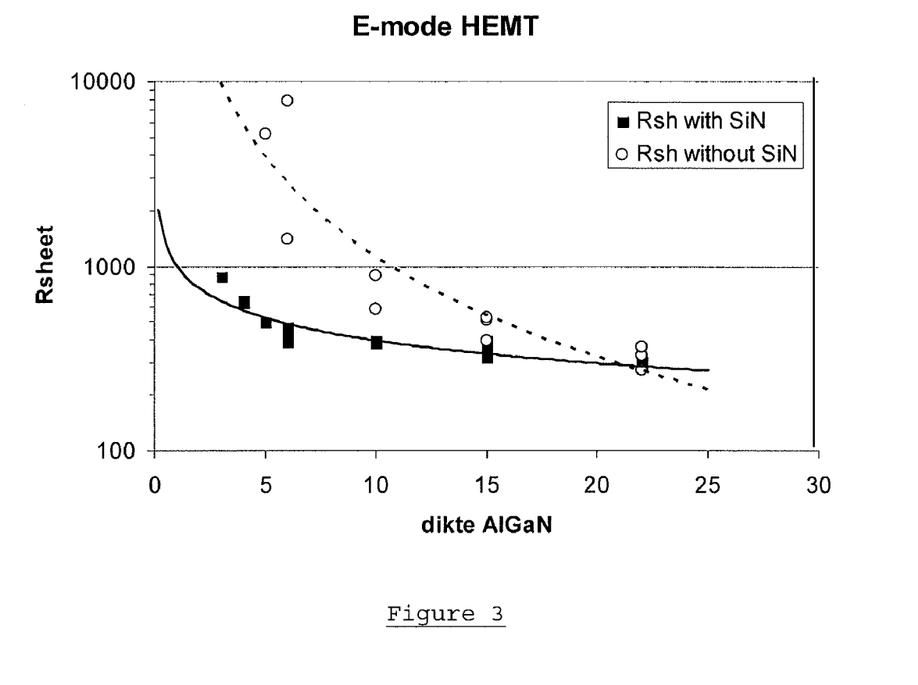
FIG. 3 illustrates sheet resistance of HEMT's with/without $Si_3N_4$.

However, with an in-situ grown $Si_3N_4$ layer as passivation on top of the $Al_xGa_{1-x}N$, the depletion from the surface states can be relieved, especially when going to very thin $Al_xGa_{1-x}N$ layers. The device is illustrated in FIG. 1. An effect of the interaction of the SiN and the AlGaN is illustrated in FIG. 3. In FIG. 3, the measured sheet resistance is plotted for samples with in-situ grown $Si_3N_4$ as passivation. Consequently, the same samples are etched in HF to remove the $Si_3N_4$ and measured again. As is clear from the FIG. 3, the $Si_3N_4$ passivation has a strong influence for very thin $Al_xGa_{1-x}N$ layers. For a well chosen value of the AlGaN thickness (e.g. 5 nm) the removal of SiN causes the 2DEG sheet resistance to change from 300Ω to more then 5000Ω.

Figure 4:
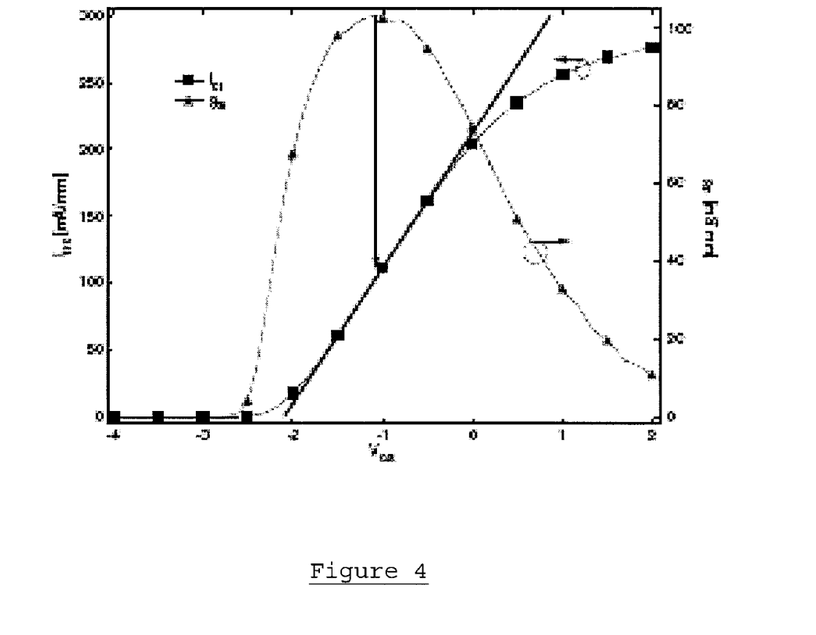
FIG. 4 illustrates the procedure to obtain the threshold voltage $V_{th}$ at maximum of $g_m$. The slope of the $I_{ds}$ curve is extrapolated to 0 where the intercept gives $V_{th}$.

The pinch-off voltage of the channel however increases when there is a $Si_3N_4$ dielectric below the gate. Therefore, for processing of E-mode transistors, the $Si_3N_4$ under the gate is etched. For the measurement of the threshold voltage the following procedure is taken (see FIG. 4). First, the point of maximum $g_m$ is defined. At this gate bias voltage, the tangent of the $I_{ds}$ curve is taken and extrapolated to zero. This bias voltage defines the threshold voltage.

Figure 5:
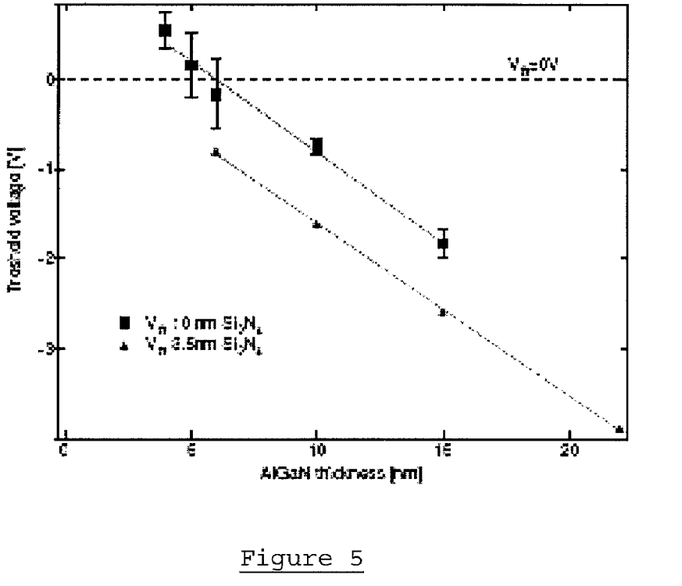
FIG. 5 illustrates $V_{th}$ as function of $Al_xGa_{1-x}N$ thickness for $Si_3N_4/Al_xGa_{1-x}N/AlN/GaN$ heterostructures.

The $V_{th}$ values are plotted in FIG. 5 as a function of $Al_xGa_{1-x}N$ thickness for $Si_3N_4/Al_{0.3}Ga_{0.7}N/AlN/GaN$ heterostructures. Two curves have been plotted for different thickness (3.5 nm versus 10 nm) of the $Si_3N_4$ passivation layer. The $Al_xGa_{1-x}N$ thickness that can be obtained for an E-mode HEMT, is a maximum of 5 nm with 10 nm $Si_3N_4$. The difference for both thicknesses of $Si_3N_4$ is related to either strain or charges in the dielectric.

Figure 6:
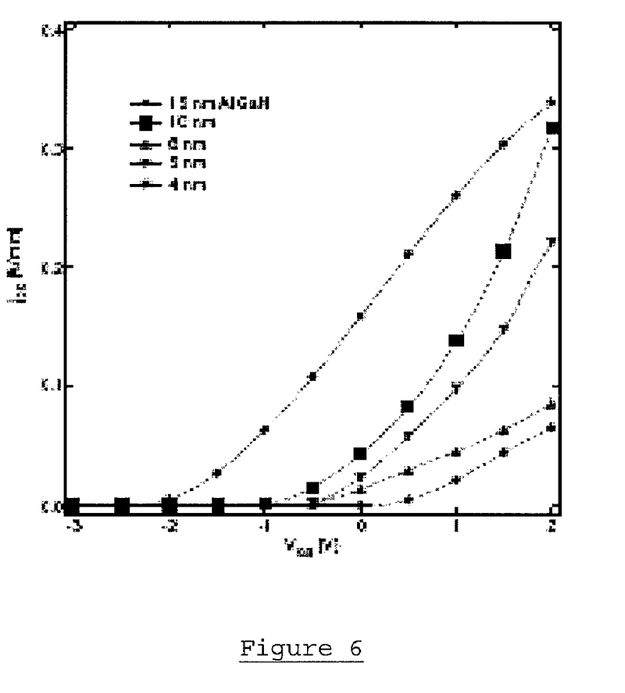
FIG. 6 illustrates $I_{DS}$-$V_{GS}$ curve for $Al_xGa_{1-x}N/AlN/GaN$ E-mode HEMTs.

The Schottky barrier of the gate metal can also be used to improve $V_{th}$. An RTA anneal on the gate metal has influence on the Schottky barrier, due to alloying of the metal with $Al_xGa_{1-x}N$. Therefore, the influence of anneal on the $V_{th}$ is investigated. The drawback of the increased $V_{th}$ is the maximum voltage on the Schottky gate metal. This is limited to +2V. When the gate voltage is higher, the Schottky gate starts to conduct. Hence, the voltage swing on the gate is limited to $V_{th}+2V$ for the 5 nm $Al_xGa_{1-x}N$ where $V_{th}\sim 0V$. In contrast, for a standard 22 nm $Al_xGa_{1-x}N$, $V_{th}$ is around −4V, so the maximum voltage applicable is $V_{th}+6V$. Due to the limited positive voltages on the gate, the drain current is also limited. An $I_{DS}$-$V_{GS}$ graph, measured at $V_{DS}$=5V, is given in FIG. 6 for all $Al_xGa_{1-x}N$ thicknesses.

The limitation in maximum gate voltage can be avoided by applying a dielectric such as $SiO_2$ or $Al_2O_3$ below the gate metal, in such a way that an insulated-gate HEMT or MOSHEMT (metal oxide semiconductor hetero structure field effect transistor) is obtained. The current can also be scaled as a function of the total gate width.

That way it is shown that an enhancement-mode $Al_{0.3}Ga_{0.7}N$/GaN HEMT can be made by reducing the $Al_xGa_{1-x}N$ thickness to 5 nm. At this thickness, the threshold voltage $V_{th}$ is +0.16V. The drain-source current of these devices is limited due to the maximum voltage of +2V on the Schottky gate contact. This limitation can be solved by scaling the gate width. Another method to improve the current of these devices is the application of an insulated gate. The resulting maximum voltage at the gate contact should allow for higher currents in these devices.

Another option is recess etch of the gate region, but this introduces defect states at the $Al_xGa_{1-x}N$ surface. That could be mitigated by an extra RTA anneal of the $Al_xGa_{1-x}N$ after the etching step. However, this introduces extra processing steps. Moreover, the etch rate should be perfectly controlled.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. An enhancement mode semiconductor device comprising:
    a first active layer on a substrate;
    a second active layer on the first active layer, the second active layer having a higher band-gap than the first active layer, and the second layer having a thickness of between 3 and 8 nm;
    a passivation layer on the second active layer;
    a source contact and a drain contact formed directly on and over the passivation layer;
    at least one hole in the passivation layer, the at least one hole being located between the source and drain contact and not protruding into the layers underlying the passivation layer;
    a gate contact in the hole, the gate contact having a width corresponding to the width of the at least one hole; and
    a two-dimensional electron gas layer present between the active layers, the electron gas layer being present outside of the location of the gate contact but not present directly underneath the gate contact when the gate and source contact are at the same voltage and the two-dimensional gas layer being present underneath the gate contact when the drain contact is at a higher potential compared to the source contact and a positive voltage is applied to the gate contact.

2. The device according to claim 1, wherein the substrate comprises a material selected from the following group: silicon, sapphire, SiC, GaN, AlN, GaAs and diamond.

3. The device according to claim 1, wherein at least one of the first and second active layer comprises a group III nitride semiconductor material.

4. The device according to claim 3, wherein the first active layer comprises a material selected from the following group: GaN, AlGaN, InGaN, InAlGaN and BN.

5. The device according to claim 3, wherein the second active layer comprises a material selected from the following group: AlGaN, AlInN, and AlInGaN.

6. The device according to claim 1, wherein the second active layer has a thickness between approximately 1 and 10 nm.

7. The device according to claim 1, wherein the passivation layer comprises a material comprising an electron donating element and nitrogen.

8. The device according to claim 7, wherein the passivation layer comprises a material selected from the group of SiN, BN, Si, CN and GeN.

9. The device according to claim 1, wherein the passivation layer has a thickness between approximately 1 nm and 5000 nm.

10. The device according to claim 9, wherein the passivation layer has a thickness between 3 nm and 20 nm.

11. The device according to claim 1, further comprising a dielectric layer located in the hole and being present between the gate contact and the second active layer.

12. The device according to claim 1, wherein the passivation layer is completely removed in the hole.

13. The device according to claim 1, wherein the passivation layer is not completely removed in the hole.

14. The device according to claim 1, further comprising a spacer layer in between the first and second active layer.

15. The device according to claim 14, wherein the spacer layer comprises an AlN layer.

16. An enhancement mode field effect transistor comprising:
    a first active layer on a substrate;
    a second active layer on the first active layer, the second active layer having a higher band-gap than the first active layer, and the second layer having a thickness of between 3 and 8 nm;
    a passivation layer on the second active layer;
    a source contact and a drain contact formed directly on and over the passivation layer;

at least one hole in the passivation layer, the at least one hole being located between the source and drain contact and not protruding into the layers underlying the passivation layer; and a gate contact in the hole, the gate contact having a width corresponding to the width of the at least one hole, wherein a two-dimensional electron gas layer between the active layers is present outside the gate contact, wherein no substantial two-dimensional electron gas layer is present between the active layers directly underneath the gate contact, when the gate and source contact are at the same voltage, and the two-dimensional gas layer being present underneath the gate contact when the drain contact is at a higher potential compared to the source contact and a positive voltage is applied to the gate contact.

17. The device according to claim 11, wherein the dielectric layer comprises a material selected from the group of SiO2, Al2O3, Ta2O5, HfO2, ZrO2, SiN, and SiON.

18. The device according to claim 16, further comprising a dielectric layer located in the hole and being present between the gate contact and the second active layer, wherein the dielectric layer comprises a material selected from the group of SiO2, Al2O3, Ta2O5, HfO2, ZrO2, SiN, and SiON.

19. The device according to claim 11, wherein the passivation layer is not completely removed from the hole.

* * * * *